United States Patent
Liu et al.

(10) Patent No.: US 10,849,229 B2
(45) Date of Patent: Nov. 24, 2020

(54) PRINTED CIRCUIT BOARD AND METHOD FOR MANUFACTURING THE SAME

(71) Applicants: Avary Holding (Shenzhen) Co., Limited., Shenzhen (CN); HongQiSheng Precision Electronics (QinHuangDao) Co., Ltd., Qinhuangdao (CN)

(72) Inventors: Rui-Wu Liu, Huaian (CN); Ming-Jaan Ho, New Taipei (TW); Lei Zhou, Shenzhen (CN); Man-Zhi Peng, Huaian (CN)

(73) Assignees: Avary Holding (Shenzhen) Co., Limited., Shenzhen (CN); HongQiSheng Precision Electronics (QinHuangDao) Co., Ltd., Qinhuangdao (CN)

( * ) Notice: Subject to any disclaimer, the term of this patent is extended or adjusted under 35 U.S.C. 154(b) by 0 days.

(21) Appl. No.: 16/243,397

(22) Filed: Jan. 9, 2019

(65) Prior Publication Data

US 2020/0137888 A1    Apr. 30, 2020

(30) Foreign Application Priority Data

Oct. 24, 2018    (CN) .......................... 2018 1 1243821

(51) Int. Cl.
*H05K 1/00* (2006.01)
*H05K 1/14* (2006.01)
(Continued)

(52) U.S. Cl.
CPC ........... *H05K 1/147* (2013.01); *H05K 1/0281* (2013.01); *H05K 3/361* (2013.01); *H05K 3/06* (2013.01);
(Continued)

(58) Field of Classification Search
CPC ...... H05K 1/147; H05K 3/361; H05K 1/0281; H05K 2201/047; H05K 2203/072; H05K 3/24; H05K 3/06
See application file for complete search history.

(56) References Cited

U.S. PATENT DOCUMENTS

| 6,040,625 | A | * | 3/2000 | Ip ........................... B81B 7/007 257/719 |
| 7,413,995 | B2 | * | 8/2008 | Sterrett ................. H01L 21/486 257/E21.219 |

(Continued)

FOREIGN PATENT DOCUMENTS

| CN | 101416567 | 8/2011 |
| CN | 102238806 | 11/2011 |
| CN | 207612464 | 7/2018 |

*Primary Examiner* — Yuriy Semenenko
(74) *Attorney, Agent, or Firm* — ScienBiziP, P.C.

(57) ABSTRACT

A method for manufacturing a printed circuit board (PCB) with high component density includes at least two reinforcing plates, at least two connecting plates, a first circuit board unit, and a second circuit board unit. The reinforcing plate includes a supporting portion, a first connecting portion, and a second connecting portion. The first connecting portion and the second connecting portion connect to ends of the supporting portion. The connecting plates are bendable circuit boards. Each connecting plate is attached to the supporting portion, the first connecting portion, and the second connecting portion of a reinforcing plate. The first circuit board unit is fixed and electrically connected to a connecting plate away from first connecting portion. The second circuit board unit is fixed and electrically connected to a connecting plate away from the second connecting portion.

11 Claims, 4 Drawing Sheets

(51) Int. Cl.
  *H05K 1/02*   (2006.01)
  *H05K 3/36*   (2006.01)
  *H05K 3/24*      (2006.01)
  *H05K 3/06*      (2006.01)

(52) U.S. Cl.
  CPC ......... *H05K 3/24* (2013.01); *H05K 2201/047* (2013.01); *H05K 2203/072* (2013.01)

(56) References Cited

U.S. PATENT DOCUMENTS

| | | | |
|---|---|---|---|
| 7,613,010 B2 * | 11/2009 | Ono | H01L 23/5385 |
| | | | 361/784 |
| 10,534,013 B2 * | 1/2020 | Maegawa | H05K 5/0091 |
| 2003/0057540 A1 | 3/2003 | Shieh | |
| 2007/0001277 A1 * | 1/2007 | Ichikawa | H05K 3/3436 |
| | | | 257/676 |
| 2009/0212407 A1 * | 8/2009 | Foster | H01L 25/105 |
| | | | 257/686 |
| 2010/0008056 A1 * | 1/2010 | Ono | H05K 1/183 |
| | | | 361/784 |
| 2019/0008047 A1 * | 1/2019 | Riou | H05K 5/0021 |

\* cited by examiner

PRINTED CIRCUIT BOARD AND METHOD FOR MANUFACTURING THE SAME

FIELD

The subject matter herein generally relates to a printed circuit board (PCB) and a method for manufacturing the PCB.

BACKGROUND

Electronic elements are mounted on PCBs. In order to increase population element density, one PCB is superimposed on another PCB and a connector is disposed between the two opposite PCBs to provide greater area.

The connector generally includes an interposer. The interposer is hollowed out to provide space for the electronic elements on the two opposite PCBs. Edge of the interposer defines through holes by mechanical drilling. Inner surfaces of the through holes are plated with metal to connect the two opposite PCBs.

The above described circuit board manufacturing method is complicated. Therefore, there is room for improvement within the art.

BRIEF DESCRIPTION OF THE DRAWINGS

Implementations of the present technology will now be described, by way of embodiments, with reference to the attached figures.

DETAILED DESCRIPTION

Figure 1:
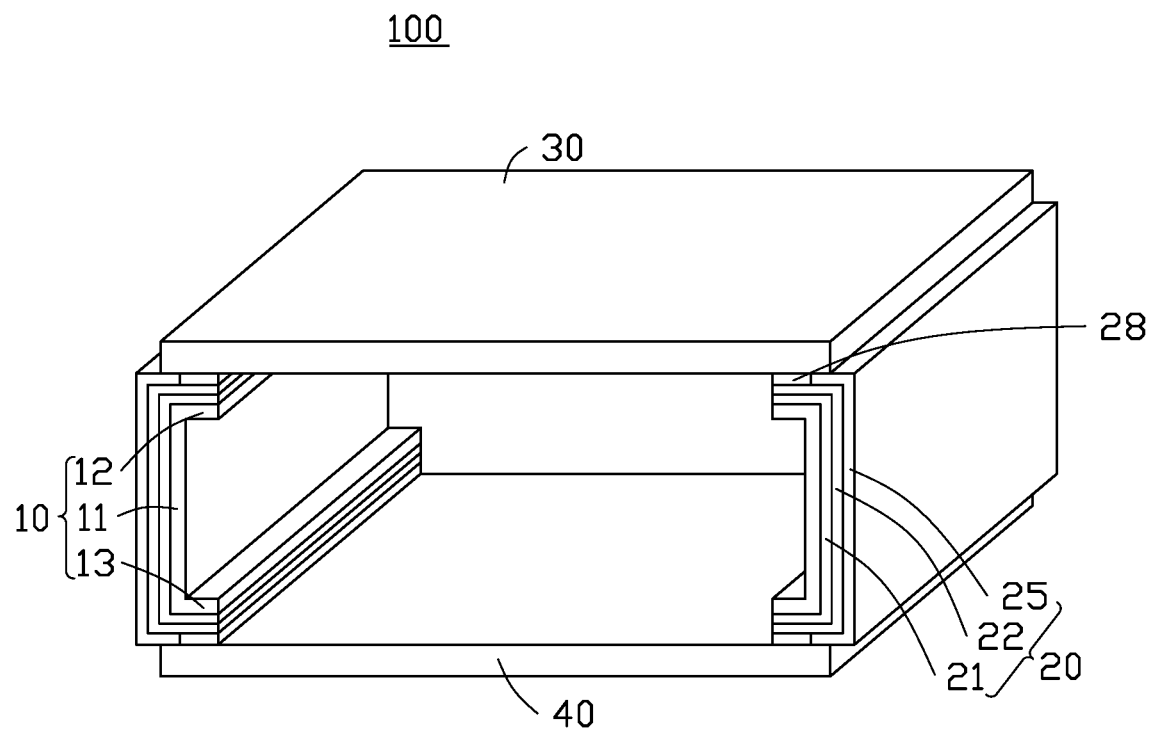
FIG. 1 is a schematic view of a PCB according to an embodiment.

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures, and components have not been described in detail so as not to obscure the related relevant feature being described. Also, the description is not to be considered as limiting the scope of the embodiments described herein. The drawings are not necessarily to scale and the proportions of certain parts may be exaggerated to better illustrate details and features of the present disclosure.

The disclosure is illustrated by way of example and not by way of limitation in the figures of the accompanying drawings, in which like references indicate similar elements. It should be noted that references to "an" or "one" embodiment in this disclosure are not necessarily to the same embodiment, and such references mean "at least one."

The term "comprising," when utilized, means "including, but not necessarily limited to"; it specifically indicates open-ended inclusion or membership in the so-described combination, group, series, and the like.

Referring to FIG. 1, a PCB 100 is provided. The PCB 100 includes at least two reinforcing plates 10, at least two connecting plates 20, a first circuit board unit 30, and a second circuit board unit 40. The reinforcing plate 10 includes a supporting portion 11, a first connecting portion 12, and a second connecting portion 13. The first connecting portion 12 and the second connecting portion 13 are connected at opposite ends of the supporting portion 11. The at least two connecting plates 20 are bendable flexible circuit boards. Each of the connecting plates 20 is attached to the supporting portion 11, the first connecting portion 12 and the second connecting portion 13 of one of the at least two reinforcing plates 10. The first circuit board unit 30 is fixed and electrically connected to a portion where each of the connecting plates 20 is attached to the first connecting portion 12. The second circuit board unit 40 is fixed and electrically connected to a portion where each of the connecting plates 20 is attached to the second connecting portion 13.

In the embodiment, the PCB 100 includes two reinforcing plates 10. The two reinforcing plates 10 are oppositely disposed between the first circuit board unit 30 and the second circuit board unit 40. In another embodiments, the PCB 100 includes four reinforcing plates 10. The four reinforcing plates 10 are disposed around edge of four sides of the first circuit board unit 30 and the second circuit board unit 40. It can be understood that the number and the positions of the reinforcing plates 10 can be set as needed as long as the first circuit board unit 30 and the second circuit board unit 40 have sufficient space.

The reinforcing plate 10 is substantially in a shape of an "E" without the middle stroke (i.e. "⊐"). In the embodiment, an angle between the first connecting portion 12 or the second connecting portion 13 and the supporting portion 11 is 90°±5°. A height of the reinforcing plate 10 is greater than or equal to a sum of a height of elements on the first circuit board unit 30 and a height of elements on the second circuit board unit 40. A width of the first connecting portion 12 is greater than or equal to a width of a connecting region of the connecting plate 20 and the first circuit board unit 30. A width of the second connecting portion 13 is greater than or equal to a width of the connecting region of the connecting plate 20 and the second circuit board unit 40.

In at least one embodiment, the reinforcing plate 10 is made of conductive material, such as stainless steel, copper, etc. The reinforcing plate 10 also can be made of insulating material, such as acrylic, liquid crystal polymer or the like. In the embodiment, the reinforcing plate 10 is made of conductive material.

Figure 2A:
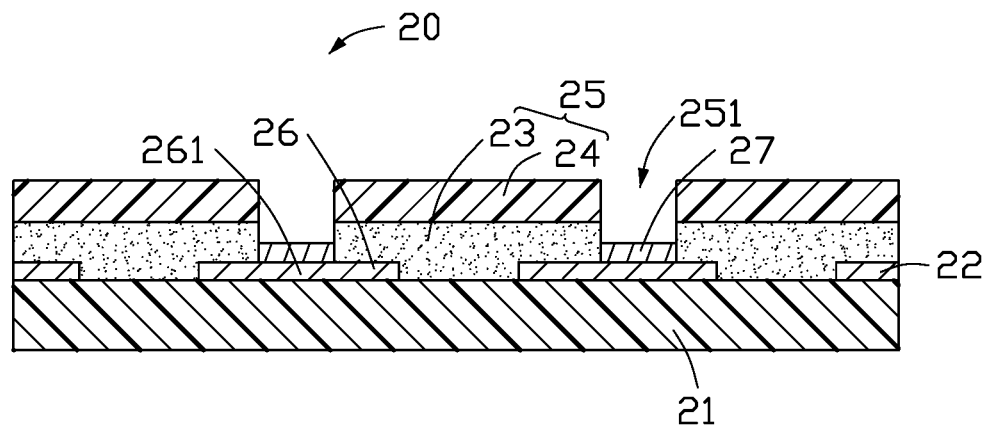
FIG. 2a is a cross-sectional view of a connecting plate of the PCB in FIG. 1.
Figure 2B:
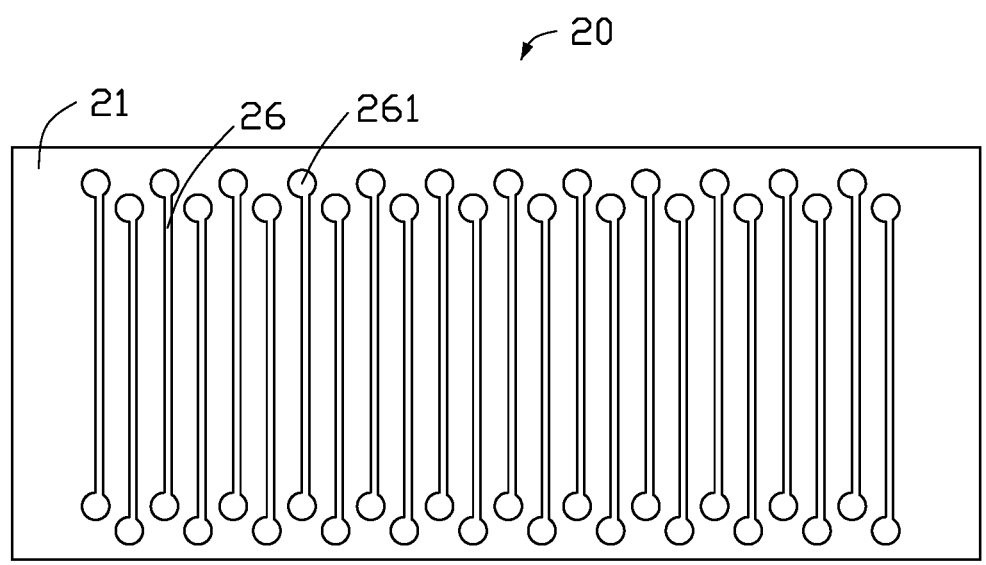
FIG. 2b is a top view of the connecting plate of the PCB in FIG. 1.

Referring to FIG. 2a and FIG. 2b, the connecting plate 20 includes a base layer 21, a wiring layer 22, and a cover layer 25. The cover layer 25 includes an adhesive layer 23 and a base film 24. A first side of the wiring layer 22 is attached to the base film 24 through the adhesive layer 23. A second side opposite to the first side of the wiring layer 22 is pressed against the base layer 21. The cover layer 25 defines a window 251 to expose portions of the wiring layer 22 near edges of the wiring layer 22, to be connected to the first circuit board unit 30 and the second circuit board unit 40.

A thickness of the wiring layer 22 is designed in accordance with a copper thickness specification of a circuit-manufacturing process. The thickness of the wiring layer 22 is less than or equal to 3 µm. The wiring layer 22 is applied with line patterning and surface treatment to form a line pattern 26, and the base film 24 is pressed by the adhesive layer 23 onto the wiring layer 22 to cover the line pattern 26. Two ends of the line pattern 26 are partly exposed through the window 251 to form an exposed portion 261. The exposed portion 261 of the line pattern 26 is surface-treated to form a protection layer 27. The protection layer 27 is electrically conductive with the line pattern 26.

The material of the base layer 21 and the base film 24 may be selected from, but are not limited to, polyimide (PI), liquid crystal polymer (LCP), and polyethylene terephthalate (Polyethylene), terephthalate, PET), and one of polyethylene naphthalate (PEN).

The adhesive layer 23 can be made of, but is not limited to, polyimide, liquid crystal polymer, polyethylene terephthalate, and polyethylene naphthalate.

The adhesive layer 23 can be made of viscous resin selected from a group consisting of polypropylene, epoxy resin, polyurethane, phenolic resin, urea-formaldehyde resin, melamine-formaldehyde resin, and polyimide.

The PCB 100 supports the first circuit board unit 30 and the second circuit board unit 40 by the reinforcing board 10. The connecting plate 20 is fixed to the reinforcing plate 10 and electrically connects the first circuit board unit 30 and the second circuit board unit 40. The thickness and the size of the reinforcing plate 10 can be adjusted as needed to reduce space. Because the process is simple, the cost can be maintained low.

Figure 3:
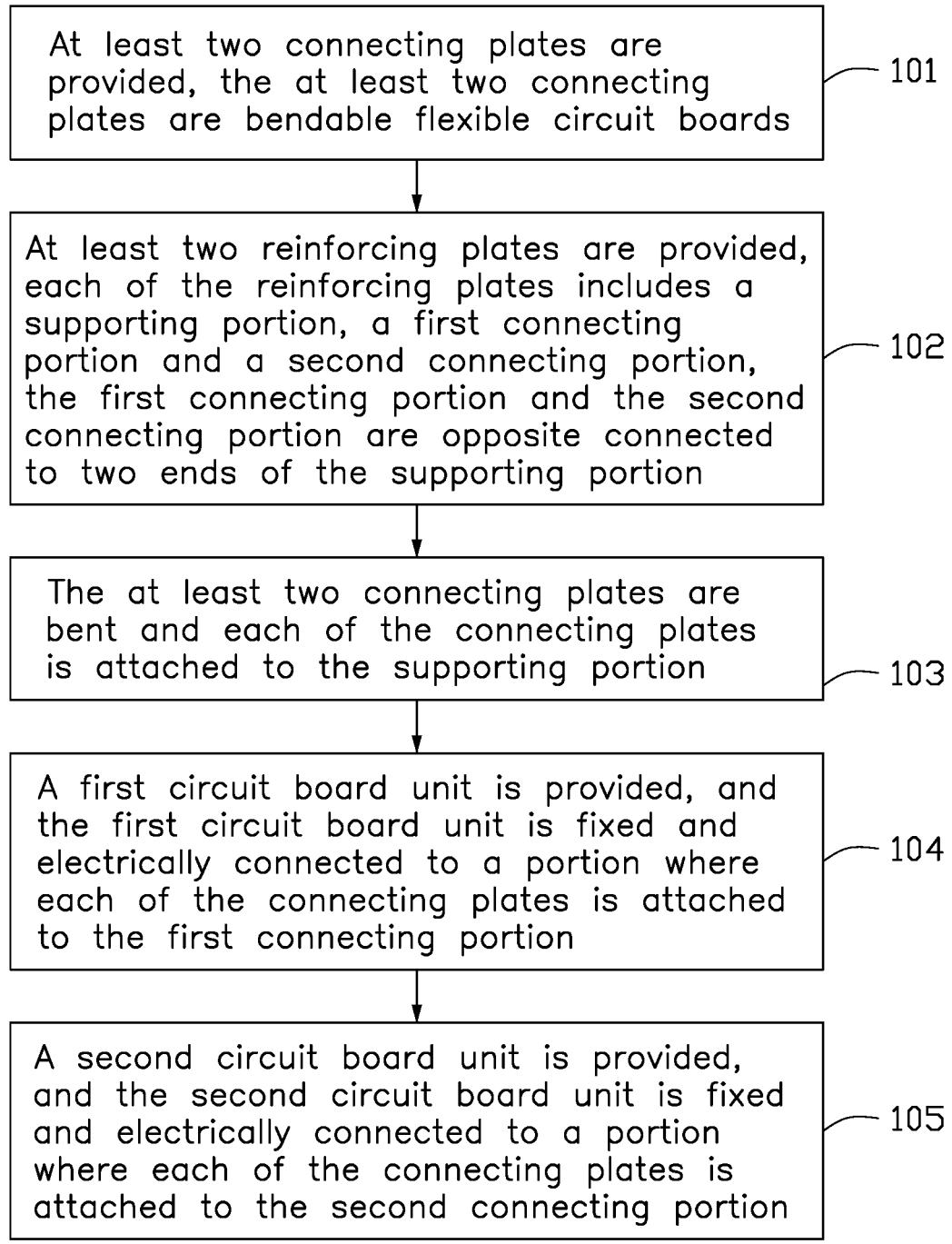
FIG. 3 is a flow chart of a method of manufacturing a PCB.

Referring to FIG. 3, a method for making a PCB 100 is presented. The method for making the PCB 100 is provided by way of embodiments, as there are a variety of ways to carry out the method. The method can begin at block 101.

At block 101, at least two connecting plates are provided. The at least two connecting plates are bendable flexible circuit boards.

At block 102, at least two reinforcing plates are provided. Each of the reinforcing plates includes a supporting portion, a first connecting portion, and a second connecting portion. The first connecting portion and the second connecting portion are connected to opposite ends of the supporting portion.

At block 103, the at least two connecting plates are bent and each of the connecting plates is attached to the supporting portion, the first connecting portion, and the second connecting portion of one of the at least two reinforcing plates.

At block 104, a first circuit board unit is provided, and the first circuit board unit is fixed and electrically connected to a portion where each of the connecting plates is attached to the first connecting portion.

At block 105, a second circuit board unit is provided, and the second circuit board unit is fixed and electrically connected to a portion where each of the connecting plates is attached to the second connecting portion.

Referring to FIG. 2a and FIG. 2b, in the embodiment, at block 101, two connecting plates 20 are provided and the two connecting plates 20 are bendable flexible circuit boards.

Figure 4:
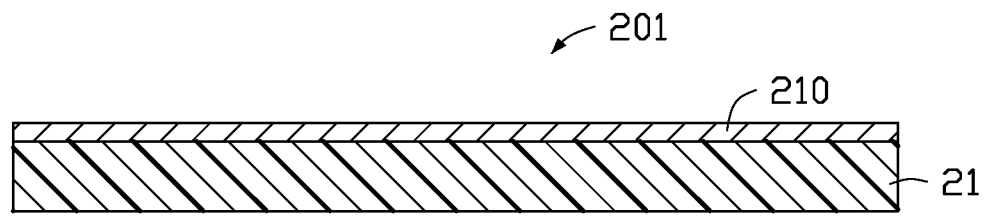
FIG. 4 is a cross-sectional view of a copper clad unit.

Referring to FIGS. 4-6 and 2a, a process for making a connecting plate 20 comprises:

Referring to FIG. 4, a copper clad unit 201 is provided. The copper clad unit 201 includes a base layer 21 and a copper foil layer 210.

Figure 5:
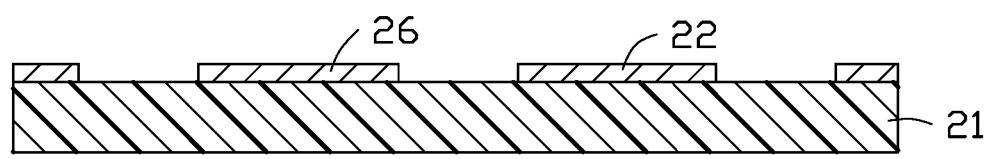
FIG. 5 is a cross-sectional view of the copper clad unit of FIG. 4 with lines.

Referring to FIG. 5, line patterning is applied to the copper foil layer 210 to form a line pattern 26, thereby obtaining a wiring layer 22.

Figure 6:
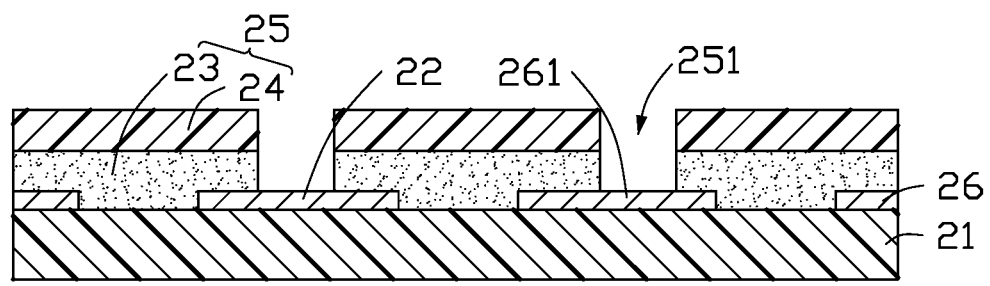
FIG. 6 is a cross-sectional view of the copper clad unit of FIG. 5 with a cover layer.

Referring to FIG. 6, a cover layer 25 is disposed on the wiring layer 22 to cover the line pattern 26. The cover layer 25 defines a window 251. A portion of the line pattern 26 exposed by the window 251 forms an exposed portion 261. The window 251 is formed by die punching, cutting operation, laser, or the like.

Referring to FIG. 2a, surface treatment is applied to the exposed portion 261 of the line pattern 26 to make electrically connection to an external structure.

FIG. 4 is a cross-sectional view of the copper clad unit 201. The copper clad unit 201 is made of an FPC raw material board, which is a single-sided copper-clad board.

FIG. 5 is a cross-sectional view of the copper clad unit 201 with lines. The line pattern 26 is formed by development, etching, and film removal.

FIG. 6 is a cross-sectional view of the copper clad unit 20 attached to the cover layer 25. The cover layer 25 includes the adhesive layer 23 and base film 24. The base film 24 is pressed against the wiring layer 22 by the adhesive layer 23 to cover the line pattern 26. A part of the line pattern 26 is exposed by the window 251.

Referring also to FIG. 2a, the surface treatment of the exposed portion 261 of the line pattern 26 may be applied by electroless nickel immersion, gold plating, oxidation prevention, electroless palladium immersion, or the like to form the protection layer 27 on the surface of the exposed portion 261 of the line pattern 26. The protection layer 27 and the line pattern 26 are electrically conductive.

Referring to FIG. 1, in the embodiment, at block 102, the two reinforcing plates 10 are provided. Each of the reinforcing plates 10 includes a supporting portion 11, a first connecting portion 12, and a second connecting portion 13. The first connecting portion 12 and the second connecting portion 13 are connected to opposite ends of the supporting portion 11.

At block 103, the at least two connecting plates 20 are bent and each of the connecting plates 20 is attached to the supporting portion 11, the first connecting portion 12, and the second connecting portion 13 of one of the at least two reinforcing plates 10.

The connecting plate 20 is adhered to the reinforcing plate 10 by a glue layer. The exposed portions 261 are located near the first connecting portion 12 and the second connecting portion 13.

At block 104, the first circuit board unit 30 is provided. The first circuit board unit 30 is fixed and electrically connected to a portion where each of the connecting plates 20 is attached to the first connecting portion 12.

Referring to FIG. 1 and FIG. 6, the first circuit board unit 30 is electrically connected to the exposed portion 261 of the connection board 20 by a conductive material 28 such as solder paste or anisotropic conductive adhesive or the like.

At block 105, the second circuit board unit 40 is provided. The second circuit board unit 40 is fixed and electrically connected to a portion where each of the connecting plates 20 is attached to the second connecting portion 13.

The second circuit board unit 40 is disposed opposite to the first circuit board unit 30. The second circuit board unit 40 is electrically connected to the exposed portion 261 of the connection board 20 by solder paste or an anisotropic conductive adhesive or the like.

Even though information and advantages of the present embodiments have been set forth in the foregoing description, together with details of the structures and functions of the present embodiments, the disclosure is illustrative only. Changes may be made in detail, especially in matters of shape, size, and arrangement of parts within the principles of the present embodiments to the full extent indicated by the plain meaning of the terms in which the appended claims are expressed.

What is claimed is:

1. A printed circuit board comprising:
a first circuit board unit;
a second circuit board unit;
at least two reinforcing plates, each of the reinforcing plates comprising a supporting portion, a first connecting portion and a second connecting portion; and
at least two connecting plates, each of the connecting plates attached to the supporting portion, the first connecting portion and the second connecting portion of one of the reinforcing plates;
wherein the first circuit board unit is fixed and electrically connected to a side of each of the connecting plates away from first connecting portion, the second circuit board unit is fixed and electrically connected to a side of each of the connecting plates away from the second connecting portion, wherein the connecting plate comprises a base layer, a wiring layer and a cover layer, the wiring layer is pressed on the base layer, the cover layer covers the wiring layer, and the cover layer defines a window to expose portions of the wiring layer adjacent to two side edges of the wiring layer, the portions of the wiring layer adjacent to two side edges of the wiring layer which are exposed are electrically connected to the first circuit board unit and the second circuit board unit, respectively.

2. The printed circuit board of claim 1, wherein each of the connecting plates is a bendable flexible circuit board.

3. The printed circuit board of claim 1, wherein the reinforcing plate is in a shape of an "E" without the middle stroke.

4. The printed circuit board of claim 1, wherein the cover layer comprises an adhesive layer and a base film, a first side of the wiring layer is attached to the base film through the adhesive layer, a second side opposite to the first side of the wiring layer is pressed against the base layer.

5. The printed circuit board of claim 1, wherein the wiring layer includes a line pattern, the cover layer covers the line pattern, two ends of the line pattern are partly exposed through the window to form the portions of the wiring layer which is exposed, the line pattern which is exposed is surface-treated to form a protection layer, the protection layer is electrically conducted to the line pattern, the protection layer is electrically conducted to the first circuit board unit and the second circuit board.

6. The printed circuit board of claim 1, wherein an adhesive layer is made of a viscous resin.

7. The printed circuit board of claim 1, wherein the printed circuit board comprises two reinforcing plates, the two reinforcing plates are oppositely disposed between the first circuit board unit and the second circuit board unit.

8. The printed circuit board of claim 1, wherein the printed circuit board comprises four reinforcing plates, each of the four reinforcing plates is disposed around a side of the first circuit board unit and a corresponding side of the second circuit board unit.

9. The printed circuit board of claim 1, wherein an angle between the first connecting portion and the supporting portion is between 85° and 95°.

10. The printed circuit board of claim 1, wherein an angle between the second connecting portion and the supporting portion is between 85° and 95°.

11. The printed circuit board of claim 1, wherein the reinforcing plate is made of conductive material.

* * * * *